United States Patent
Komatsu (10) Patent No.: US 7,912,160 B2
(45) Date of Patent: Mar. 22, 2011

(54) MODULATION CIRCUIT HAVING DC OFFSET LEVEL CONTROL CIRCUIT

(75) Inventor: Yasushi Komatsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 677 days.

(21) Appl. No.: 11/870,648

(22) Filed: Oct. 11, 2007

(65) Prior Publication Data

US 2008/0089453 A1   Apr. 17, 2008

(30) Foreign Application Priority Data

Oct. 13, 2006   (JP) ................................. 2006-280307

(51) Int. Cl.
*H04L 27/14*   (2006.01)

(52) U.S. Cl. ........ 375/346; 375/295; 375/296; 375/316; 375/340; 455/91; 455/114.3; 330/149

(58) Field of Classification Search .................. 375/295, 375/296, 340, 346; 455/91, 114.3; 330/149
See application file for complete search history.

(56) References Cited

U.S. PATENT DOCUMENTS

| | | | | |
|---|---|---|---|---|
| 6,693,863 | B2 * | 2/2004 | Shoji et al. .................. | 369/47.35 |
| 7,599,448 | B2 * | 10/2009 | Ahmed et al. ................ | 375/300 |
| 2007/0121757 | A1 * | 5/2007 | Chu et al. ...................... | 375/296 |

FOREIGN PATENT DOCUMENTS

| | | |
|---|---|---|
| GB | 2 334 187 | 8/1999 |
| JP | 3308811 | 5/2002 |
| JP | 2005-295376 | 10/2005 |

OTHER PUBLICATIONS

Chinese Official Action-200710162466.1-Jan. 4, 2011.

* cited by examiner

*Primary Examiner* — David C Payne
*Assistant Examiner* — Leon Flores
(74) *Attorney, Agent, or Firm* — Young & Thompson (57) ABSTRACT

A modulation circuit according to the present invention includes: a modulator modulating a received signal and outputting a modulated signal; a detector circuit receiving the modulated signal and outputting a envelope of the modulated signal; and a first controller regulating an offset level of the modulator based on the envelope.

5 Claims, 9 Drawing Sheets

Fig. 4A  CARRIER SIGNAL

Fig. 4B  TEST SIGNAL

Fig. 4C  MODULATION SIGNAL (ENVELOPE)

Fig. 5A CARRIER SIGNAL

Fig. 5B TEST SIGNAL (+DC OFFSET)

Fig. 5C MODULATION SIGNAL (ENVELOPE)

MODULATION CIRCUIT HAVING DC OFFSET LEVEL CONTROL CIRCUIT

BACKGROUND OF THE INVENTION

1. Field of the invention

The present invention relates to a modulation circuit, and more specifically to a modulation circuit that includes a DC offset level control circuit.

2. Description of Related Art

A modulation circuit has conventionally been used for communication systems. The modulation circuit is a circuit outputting a modulation signal based on a baseband signal and a carrier wave (hereinafter referred to as carrier). When the modulation circuit is used, a DC offset can occur in the modulation circuit due to a disturbance of an element, for example. To be more precise, for example, the DC offset occurs in I/Q base band signals inputted to a orthogonal modulator when a orthogonal modulation is performed using the orthogonal modulator. When the DC offset occurs, a carrier frequency component called carrier leak appears in an output frequency, which causes a degradation of a signal quality. Japanese Unexamined Patent Application Publication No. 2005-295376 and Japanese Patent No. 3308811 disclose a modulation circuit for correcting a DC offset for the purpose of suppressing such a carrier leak.

Figure 8:
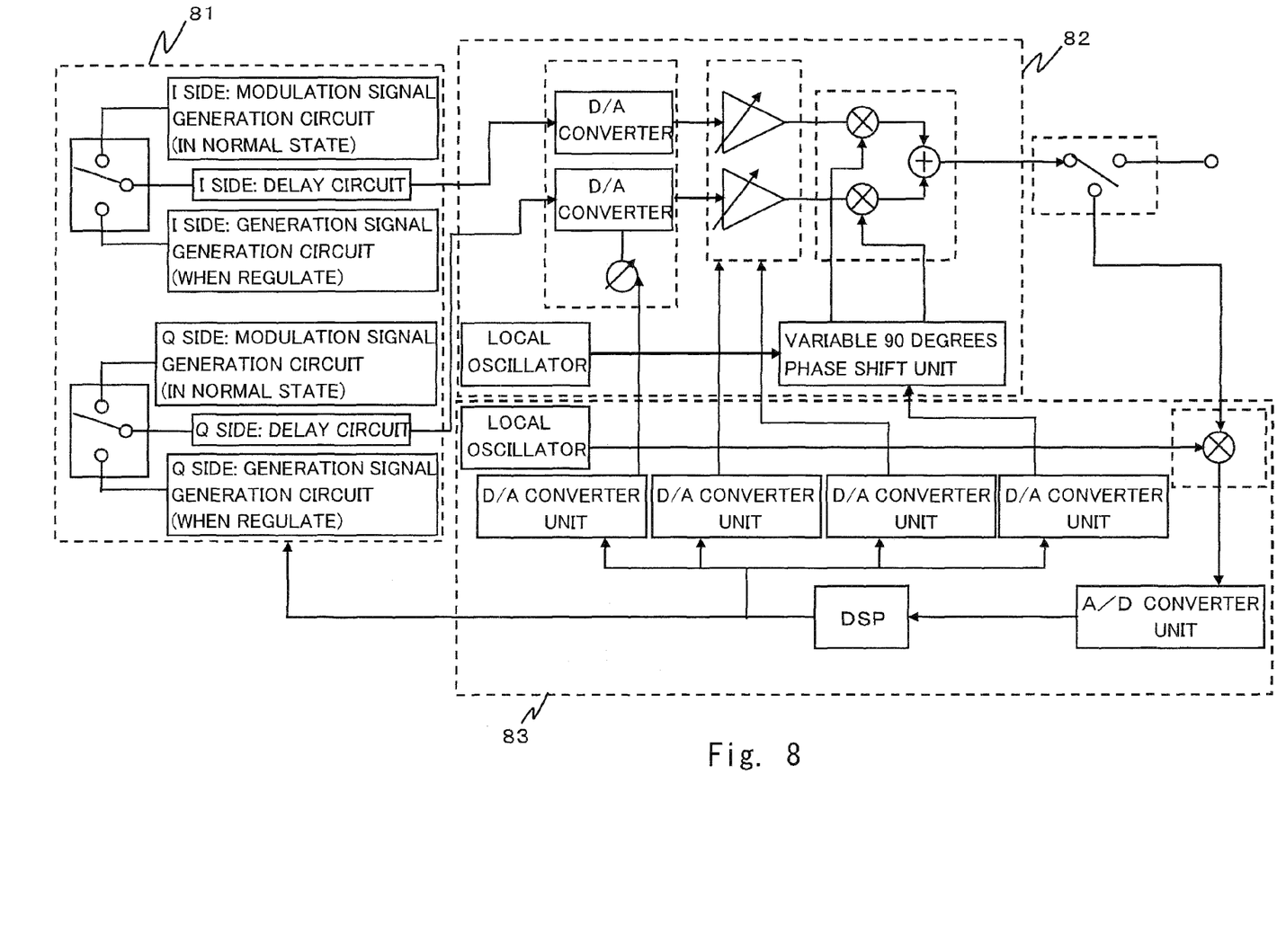
FIGS. 8 and 9 are diagrams showing a conventional modulation circuit respectively.

FIG. 8 shows a modulation circuit 80 disclosed in Japanese Unexamined Patent Application Publication No. 2005-295376. The modulation circuit 80 shows a baseband signal generator 81, an orthogonal modulator 82, and a carrier leak regulator 83. In this case, the orthogonal modulator 82 outputs a modulation signal based on a baseband signal output by the baseband signal generator 81 and a carrier signal output by a local oscillator unit which is inside the orthogonal modulator 82. Then the modulation signal which was once modulated is demodulated to a baseband frequency band by a demodulator which is inside the carrier leak regulator 83 again. After that, the orthogonal modulator 82 is regulated so that a carrier leak component becomes minimum by detecting the carrier leak component that exists in the modulation signal, and the DC offset is corrected.

Figure 9:
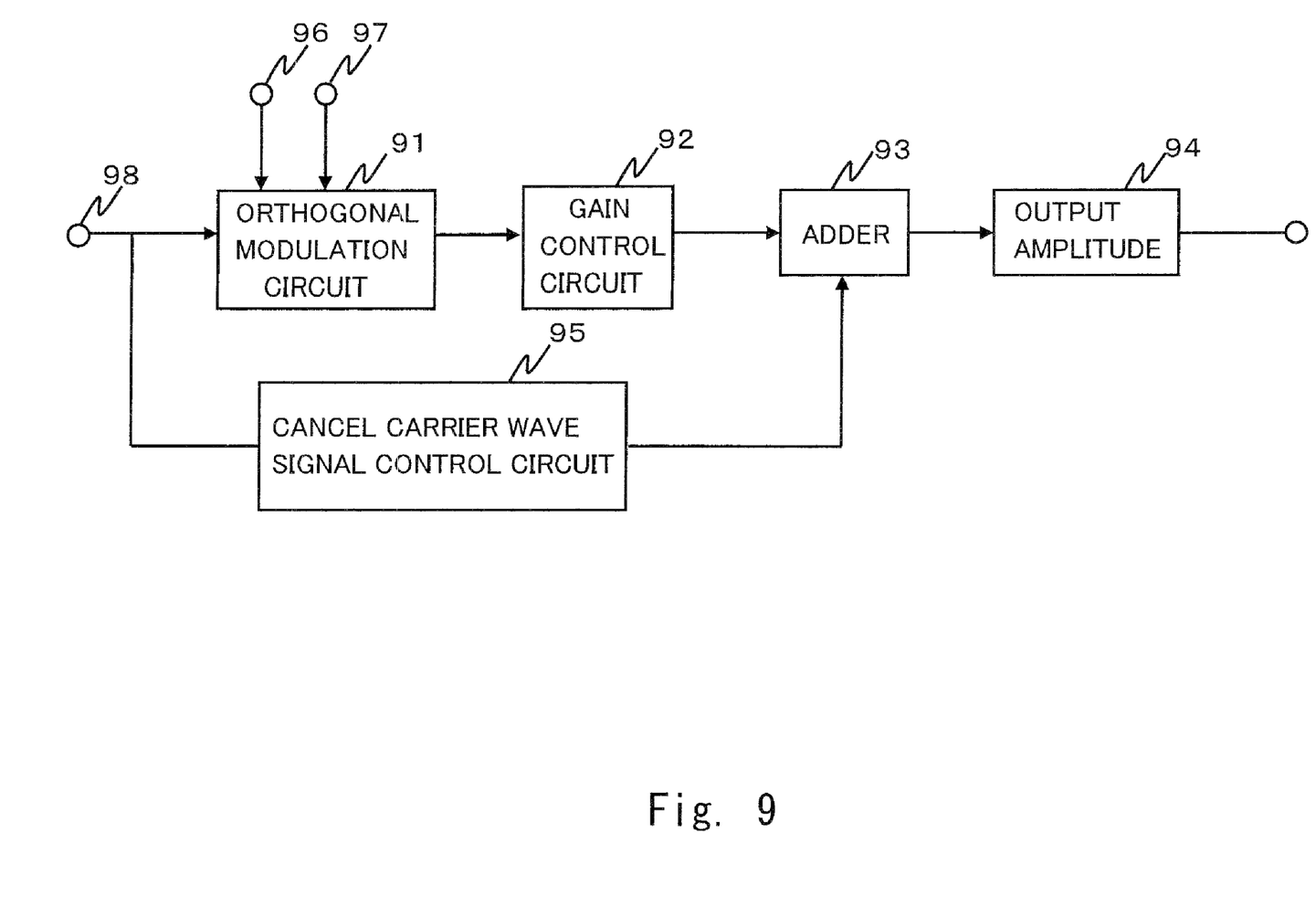

FIG. 9 shows a modulation circuit 90 disclosed in Japanese Patent No. 3308811. In FIG. 9, a cancel carrier wave signal control circuit 95 generates a carrier signal. The carrier signal has an opposite phase to a carrier leak output by an orthogonal modulation circuit 91. An adder 93 cancels the carrier leak by adding a DC offset generated in an orthogonal modulation circuit 91 to the signal output by the orthogonal modulation circuit 91. A gain control circuit 92 controls a gain.

However, in the technology disclosed in Japanese Unexamined Patent Application Publication No. 2005-295376, there is a need to demodulate the signal modulated by the orthogonal modulator 82 by the carrier leak regulator 83 again, which increases a size of the circuit. In the technology disclosed in Japanese Unexamined Patent Application Publication No. 2005-295376, there is no function for controlling the gain in the modulation circuit.

In the technology disclosed in Japanese Patent No. 3308811, there is a need to create a signal which has the opposite phase to the carrier leak and which has the same amplitude to the carrier leak by a cancel carrier wave signal, which makes it difficult to cancel the carrier leak with high accuracy. Also another control circuit is needed for regulating a gain by the gain control circuit 92 and a gain by the cancel frequency wave signal control circuit 95. In the technologies disclosed in Japanese Unexamined Patent Application Publication No. 2005-295376 and Japanese Patent No. 3308811, it is difficult to control the gain and suppress the carrier leak while suppressing the size of the circuit.

As stated above, in the conventional modulation circuits, it is difficult to suppress the carrier leak and control the gain while suppressing the size of the circuit.

SUMMARY

According to one aspect of the present invention, there is provided a modulation circuit including: a modulator modulating a received signal and outputting a modulated signal; a detector circuit receiving the modulated signal and outputting a envelope of the modulated signal; and a first controller regulating an offset level of the modulator based on the envelope.

According to the modulation circuit of the present invention, it is possible to suppress the carrier leak by correcting a DC offset component and to control the gain at the same time. Also it is possible to suppress an increase of a size of the circuit.

According to the modulation circuit of the present invention, it is possible to suppress the carrier leak and to control the gain at the same time.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiment 1

Figure 1:
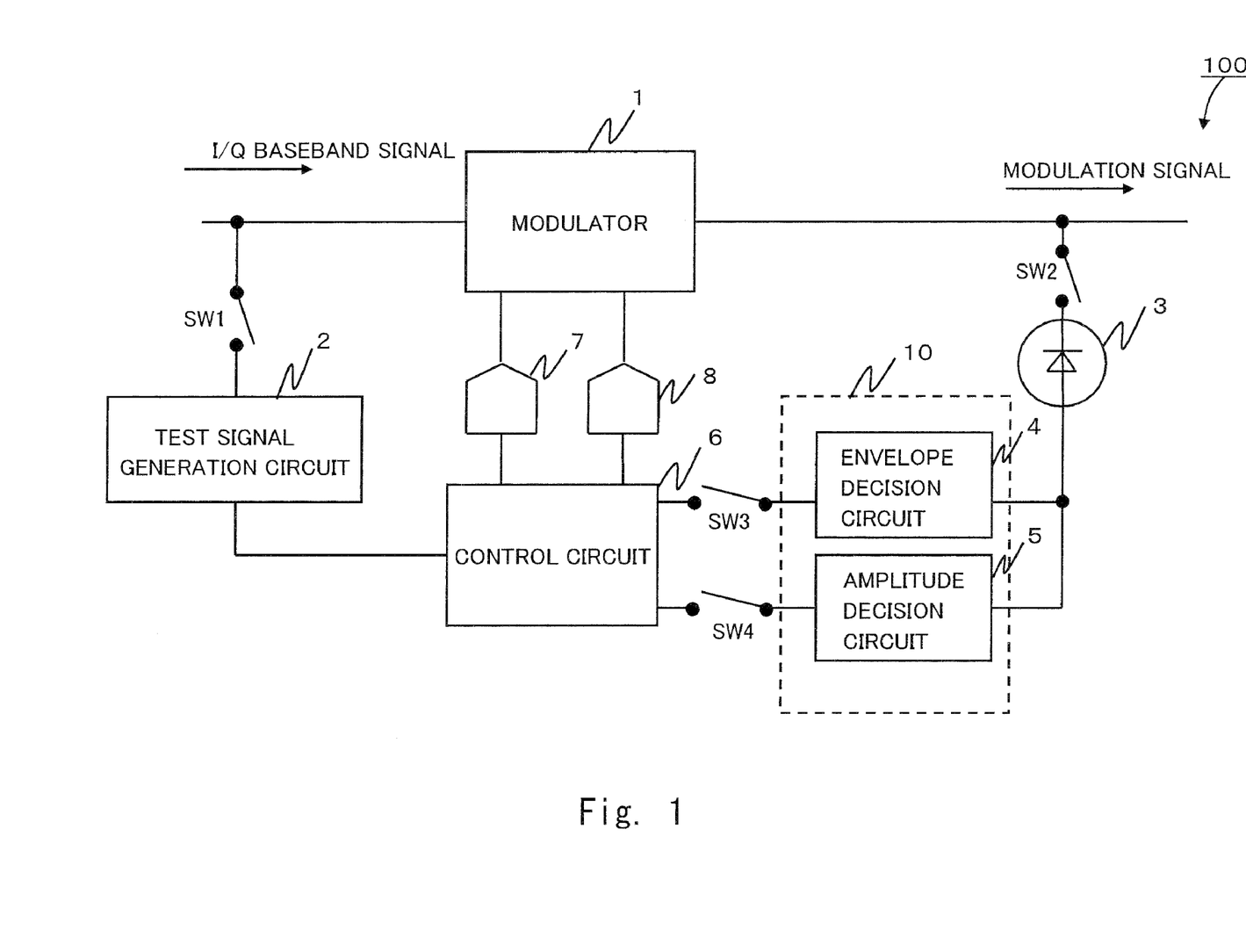
FIG. 1 shows a modulation circuit 100 according to the embodiment of the present invention.

The embodiment of the present invention will now be described with reference to the drawings. FIG. 1 is a block diagram showing a typical modulation circuit according to the embodiment 1 of the present invention. As shown in FIG.

Figure 2:
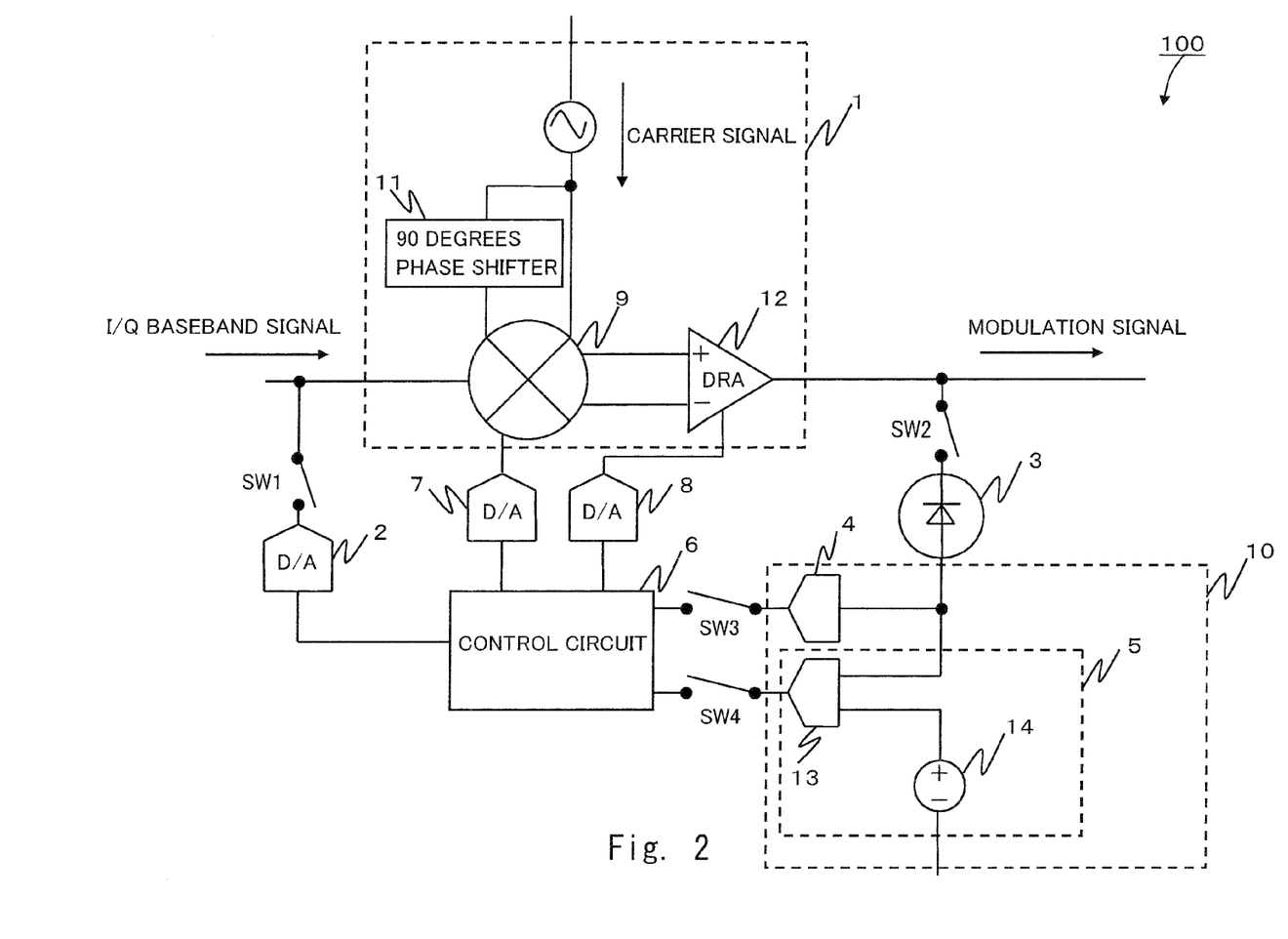
FIG. 2 shows the modulation circuit 100 according to the embodiment of the present invention.

1, the modulation circuit 100 of this embodiment includes a modulator 1, a test signal generation circuit 2, a detector (hereinafter referred to as envelope detection circuit) 3, a first controller, and a second controller. The first controller includes a decision circuit 10, a control circuit 6, and a first control circuit (hereinafter referred to as DC offset regulation circuit) 7. The second controller includes the decision circuit 10, the control circuit 6, and a second control circuit (hereinafter referred to as gain regulation circuit) 8. The decision circuit 10 includes an envelope decision circuit 4 and an amplitude decision circuit 5. FIG. 2 is a block diagram showing a typical modulation circuit shown in FIG. 1 more specifically. The modulation circuit 100 will be explained below in detail with reference to FIG. 2.

In FIG. 2, the modulator 1 shown in FIG. 1 includes an orthogonal modulator 9, a phase detector 11, and an output amplifier 12. The amplitude decision circuit 5 shown in FIG. 1 is composed of a comparing unit 13 and a reference voltage generator 14. The envelope decision circuit 4 includes a first sample-and-hold circuit 16, a second sample-and-hold circuit 17, and a comparator 15 (see FIG. 7).

The orthogonal modulator 9 is a circuit multiplying an orthogonal baseband signal I and Q (hereinafter referred to as I/Q baseband signal) by a carrier wave (hereinafter referred to as carrier signal) and outputting a modulation signal. The phase detector 11 is a circuit generating the carrier signal having a phase difference of 90 degrees. The output amplifier 12 is a circuit amplifying and outputting the modulation signal output by the orthogonal modulator 9.

The test signal generation circuit 2 is a circuit for outputting a test signal for correcting a DC offset generated in the orthogonal modulator 9. In the present embodiment, the test signal generation circuit 2 is composed of a D/A converter. The test signal in this case means a signal which has an equal amplitude in a positive direction and a negative direction from a reference potential (see FIG. 4B). A first switch SW1 is connected between the orthogonal modulator 9 and the test signal generation circuit 2.

The modulation signal output by the orthogonal modulator 9 is input to the envelope detection circuit 3 through the output amplifier 12. Note that the envelope detection circuit 3 according to this embodiment detects the envelope of the modulation signal output by the orthogonal modulator 9. The envelope detection circuit 3 detects a peak level of the modulation signal, so the envelope detection circuit 3 can be composed only of a diode. A second switch SW2 is connected between the output amplifier 12 and the envelope detection circuit 3.

Figure 7:
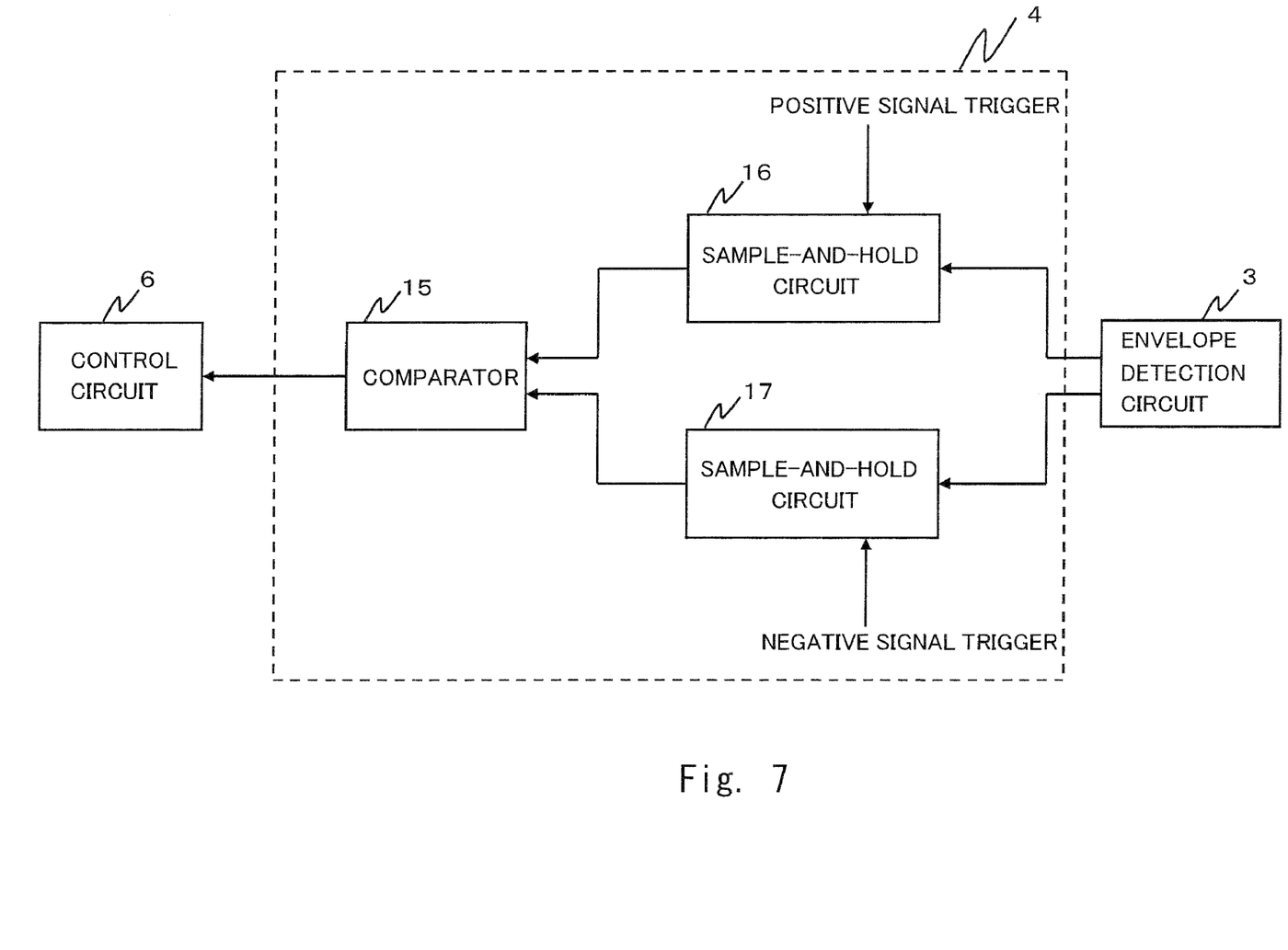
FIG. 7 is a configuration diagram showing an inside of an envelope decision circuit according to the embodiment of the present invention.

The envelope decision circuit 4 is a circuit for comparing a maximum amplitude value with a minimum amplitude value of the envelope extracted by the envelope detection circuit 3. A configuration of the envelope decision circuit 4 according to the present embodiment is shown in FIG. 7. The first sample-and-hold circuit 16 and the second sample-and-hold circuit 17 are connected in parallel. Output parts of the first sample-and-hold circuit 16 and the second sample-and-hold circuit 17 are connected to the comparator 15.

The comparing unit 13 is a circuit for comparing the envelope output by the envelope detection circuit 3 with the signal output by the reference voltage generator 14.

The control circuit 6 is a circuit for controlling the DC offset regulation circuit 7 based on a comparison result by the envelope decision circuit 4 and for controlling the gain regulation circuit 8 based on a comparison result by the comparing unit 13. A third switch SW3 is connected between the envelope decision circuit 4 and the control circuit 6, and a fourth switch SW4 is connected between the comparing unit 13 and the control circuit 6.

The DC offset regulation circuit 7 is a circuit for regulating the DC offset so that the amplitude of the envelope of the signal output from the modulator becomes constant. The gain regulation circuit 8 is a circuit having a function capable of varying the amplitude of the signal output from the modulator. The DC offset regulation circuit 7 and the gain regulation circuit 8 are composed of the D/A converter. Referring now to FIGS. 3 to 7, the behavior of the modulation circuit 100 shown in FIG. 2 in a normal state and when the DC offset is corrected will be described in detail.

First, an ideal behavior of the modulation circuit 100 shown in FIG. 2 in the normal state is described. For example, the I/Q baseband signal and the carrier signal having the phase difference of 90 degrees with the I/Q baseband signal are input to the orthogonal modulator 9. We assume that a sinusoidal wave component ($\sin(\omega_B t)$) and a cosine wave component ($\cos(\omega_B t)$) are input to the orthogonal modulator 9 as the I/Q baseband signal, and a sinusoidal wave component ($\sin(\omega_L t)$) and a cosine wave component ($\cos(\omega_L t)$) are input to the orthogonal modulator 9 as the carrier signal. Now the modulation signal output by the orthogonal modulator 9 is expressed by the following equation.

$$\sin \omega_B t * \cos \omega_L t + \cos \omega_B t * \sin \omega_L t = \sin(\omega_L t + \omega_B t)$$

Figure 3:
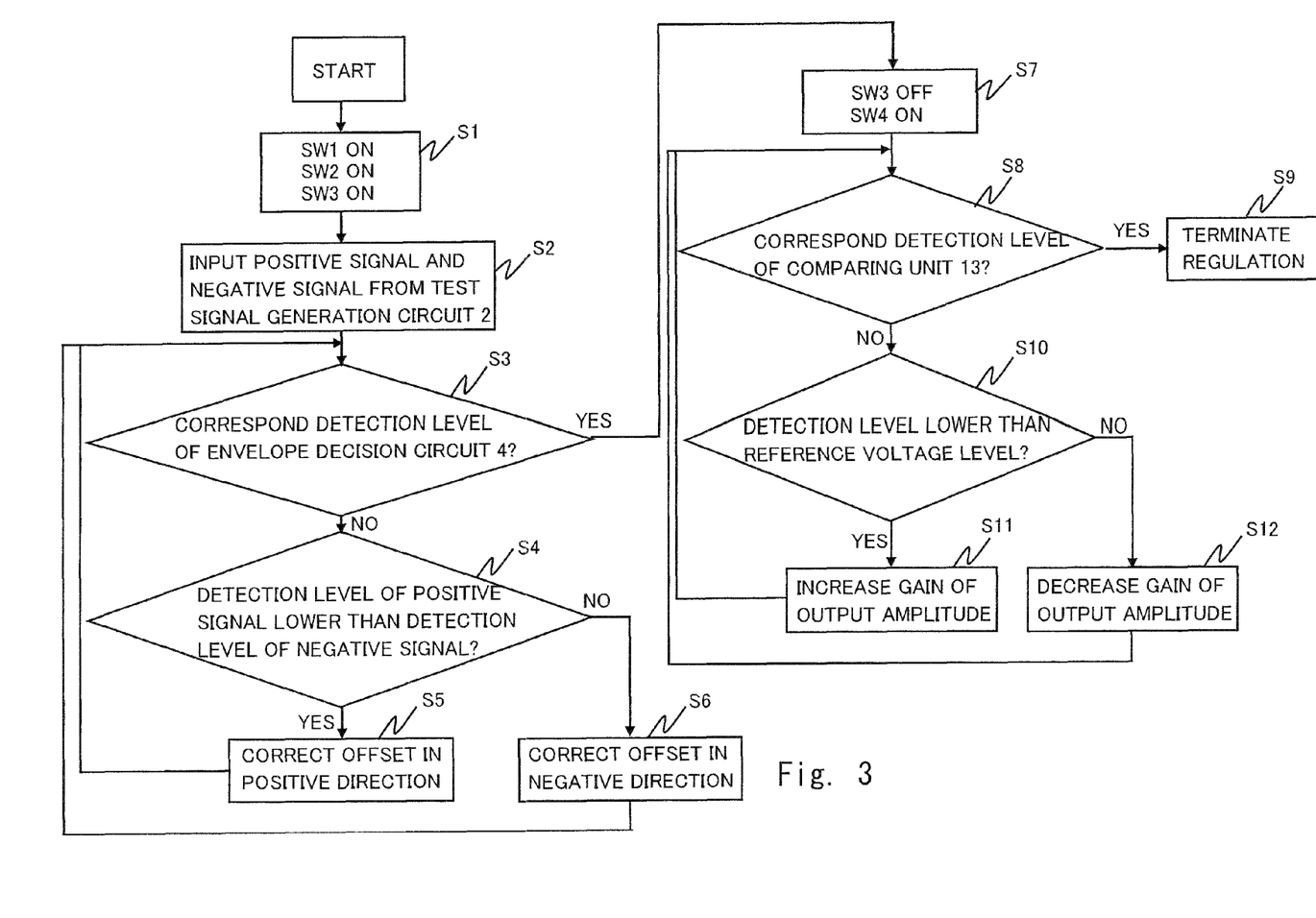
FIG. 3 is a flow chart of the modulation circuit 100 according to the embodiment of the present invention.

Referring now to FIG. 3, the description will be made when the test signal is input to the orthogonal modulator 9. Note that the test signal may be a sinusoidal wave or a rectangular wave. First the description is made when the rectangular wave is output. Firstly the switches SW1 to SW3 are turned on (see S1 in FIG. 3). Then the test signal generation circuit 2 inputs the test signal into the orthogonal modulator 9 (see S2 in FIG. 3). The envelope detection circuit 3 extracts the envelope of the output signal by the orthogonal modulator 9 based on the modulation signal output by the orthogonal modulator 9 through the output amplifier 12.

Then the envelope decision circuit 4 compares the level of the envelope (see S3 in FIG. 3). For example, when a first amplitude value of the envelope corresponding to a positive signal level of the test signal held in the first sample-and-hold circuit 16 is the same as a second amplitude value of the envelope corresponding to a negative signal level of the test signal held in the second sample-and-hold circuit 17, it can be confirmed that the DC offset does not occur.

Figures 4A, 4B, 4C:
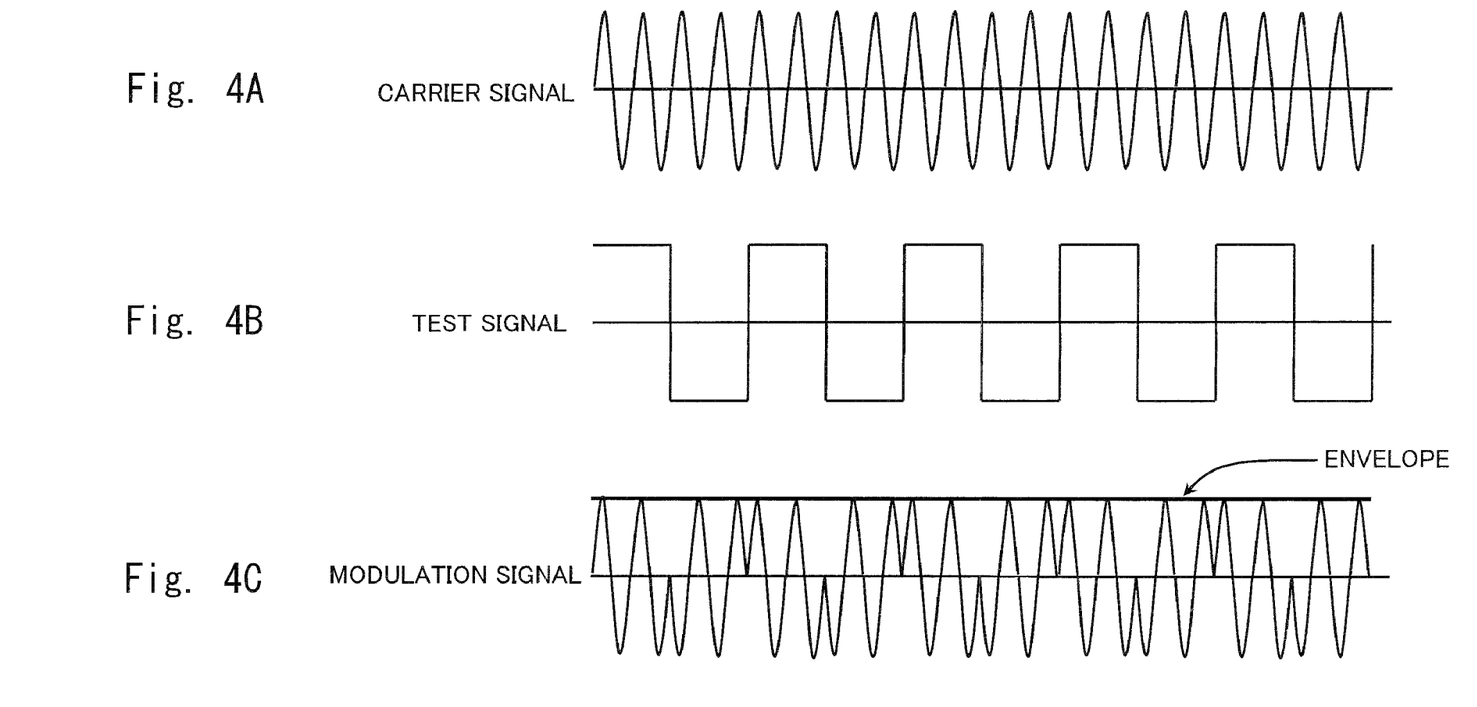
FIGS. 4A to 4C each shows a signal waveform diagram when a DC offset does not exist according to the embodiment of the present invention.

FIGS. 4A to 4C each shows a signal waveform diagram when the DC offset does not occur. The modulation signal output by the orthogonal modulator 9 based on the inputs of the carrier signal (see FIG. 4A) and the test signal (see FIG. 4B) is input to the envelope detection circuit 3 through the output amplifier 12. When the DC offset does not exist, the envelope extracted by the envelope detection circuit 3 becomes constant (see FIG. 4C).

On the other hand, when the first amplitude value of the envelope corresponding to the positive signal level of the test signal held in the first sample-and-hold circuit 16 is smaller than the second amplitude value of the envelope corresponding to the negative signal level of the test signal held in the second sample-and-hold circuit 17 at a certain point (see S4 in FIG. 3), the DC offset regulation circuit 7 outputs the control signal based on the control circuit 6 for correcting the DC offset existing in the modulator 1 in the positive direction (see 5S in FIG. 3).

When the first amplitude value of the envelope corresponding to the positive signal level of the test signal held in the first sample-and-hold circuit 16 is larger than the second amplitude value of the envelope corresponding to the negative signal level of the test signal held in the second sample-and-hold circuit 17 at a certain point, the DC offset regulation circuit 7 outputs the control signal based on the control circuit 6 for correcting the DC offset existing in the modulator 1 in the negative direction (see S6 in FIG. 3).

Figure 5A:
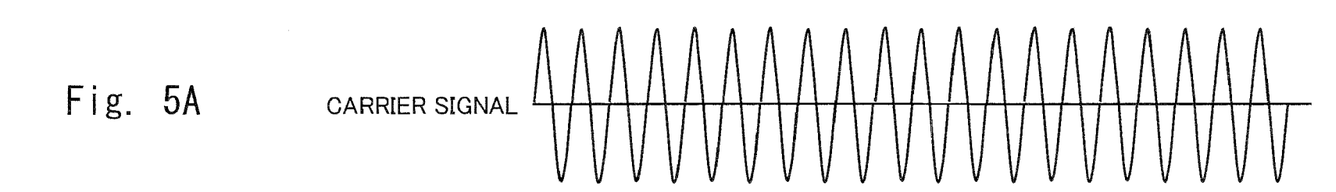
FIGS. 5A to 5C each shows a signal waveform diagram when a test signal of a rectangular wave is used according to the embodiment of the present invention.
Figure 5B:
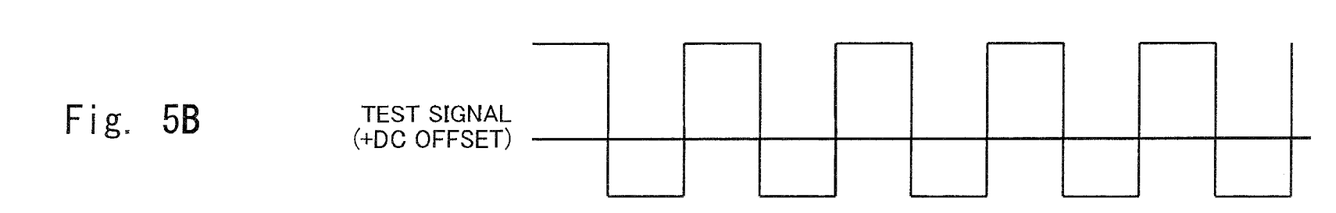
Figure 5C:
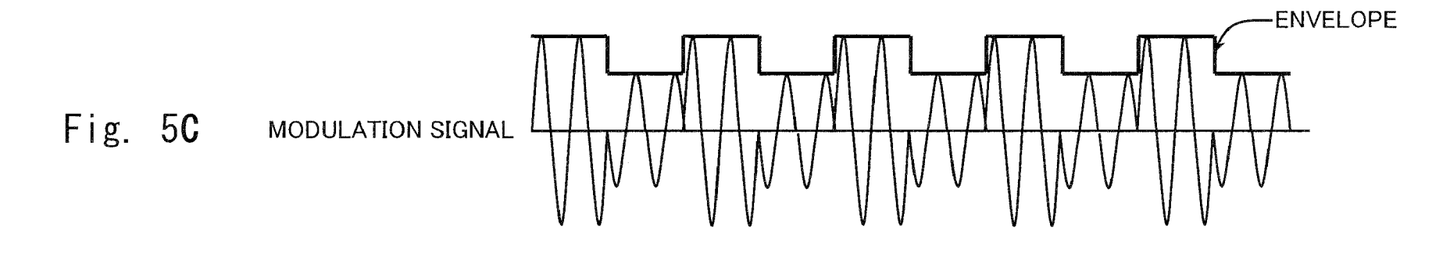

FIGS. 5A to 5C each shows a signal waveform diagram when the DC offset exists. In this case, the DC offset exists in the modulator 1, so the modulation signal including the DC offset is output. Then the modulation signal output by the orthogonal modulator 9 based on the inputs of the carrier signal (see FIG. 5A) and the test signal (see FIG. 5B) is input to the envelope detection circuit 3 through the output amplifier 12.

The envelope detection circuit 3 extracts the envelope which is proportional to the DC offset (see FIG. 5C). In other words, a fluctuation which is proportional to the DC offset is occurred in the output signal of the modulator 1 based on the modulation signal including the DC offset. So the fluctuation which is proportional to the DC offset is occurred also in the envelope extracted by the envelope detection circuit 3.

Then the DC offset regulation circuit 7 behaves based on the comparison result by the envelope decision circuit 4. More specifically, when the amplitude value of the envelope corresponding to the positive signal level of the test signal is lower than the amplitude value of the envelope corresponding to the negative signal level of the test signal, the DC offset regulation circuit 7 outputs the control signal correcting the DC offset in the positive direction. On the other hand, when the amplitude value of the envelope corresponding to the positive signal level of the test signal is higher than the amplitude value of the envelope corresponding to the negative signal level of the test signal, the DC offset regulation circuit 7 outputs the control signal correcting the DC offset in the negative direction.

After the DC offset regulation circuit 7 outputs the control signal correcting the DC offset in the positive direction or the negative direction, the envelope decision circuit 4 compares the level of the envelope again (see S3 in FIG. 3). This action is repeatedly performed until the DC offset is corrected (see S3, S4, S6, and S7 in FIG. 3) Once the DC offset is corrected, the envelope extracted by the envelope detection circuit 3 is smoothed and becomes constant. Next the gain is controlled in the modulator 1.

First the third switch SW3 is turned off and the fourth switch SW4 is turned on (see S7 in FIG. 3). The comparing unit 13 compares a level signal of the envelope extracted by the envelope detection circuit 3 with a reference voltage signal output by the reference voltage generator 14 (see S8 in FIG. 3). The reference voltage signal output by the reference voltage generator 14 is an expectation value that is to be output by the output amplifier 12. The signal output by the envelope detection circuit 3 is the level signal in which the DC offset is corrected and the envelope is smoothed.

As a result of comparing by the comparing unit 13, in a case where the envelope output by the envelope detection circuit 3 is smaller than the reference voltage signal (see S10 in FIG. 3), the gain regulation circuit 8 outputs the control signal that increases the gain of the modulator 1 (see S11 in FIG. 3).

When the envelope output by the envelope detection circuit 3 is larger than the reference voltage signal, the gain regulation circuit 8 outputs the control signal that decreases the gain of the modulator 1 (see S12 in FIG. 3). Then the level comparison is performed by the comparing unit 13 again (see S8 in FIG. 3). This action is repeatedly performed until the level of the signal output by the envelope detection circuit 3 is the same as the level of the reference voltage signal (see S8, S10, S11, and S12 in FIG. 3). When the detection level in the comparing unit 13 becomes constant, the regulation is completed (see S9 in FIG. 3).

As stated above, the gain regulation circuit 8 behaves based on the comparison result of the comparing unit 13. More specifically, when the signal output by the envelope detection circuit 3 is lower than the reference voltage signal, the gain regulation circuit 8 outputs the control signal that increases an output gain to the orthogonal modulator 9 or the output amplifier 12. On the other hand, when the signal output by the envelope detection circuit 3 is higher than the reference voltage signal, the gain regulation circuit 8 outputs the control signal that decreases the output gain to the orthogonal modulator 9 or the output amplifier 12.

The above description is about a case in which the test signal generation circuit 2 outputs the test signal of the rectangular wave. However the sinusoidal wave may be input, for example. Now, a case in which the sinusoidal wave is input as the test signal will be explained. The same description as the case in which the rectangular wave is used as the test signal will be omitted here.

Figures 6A, 6B:
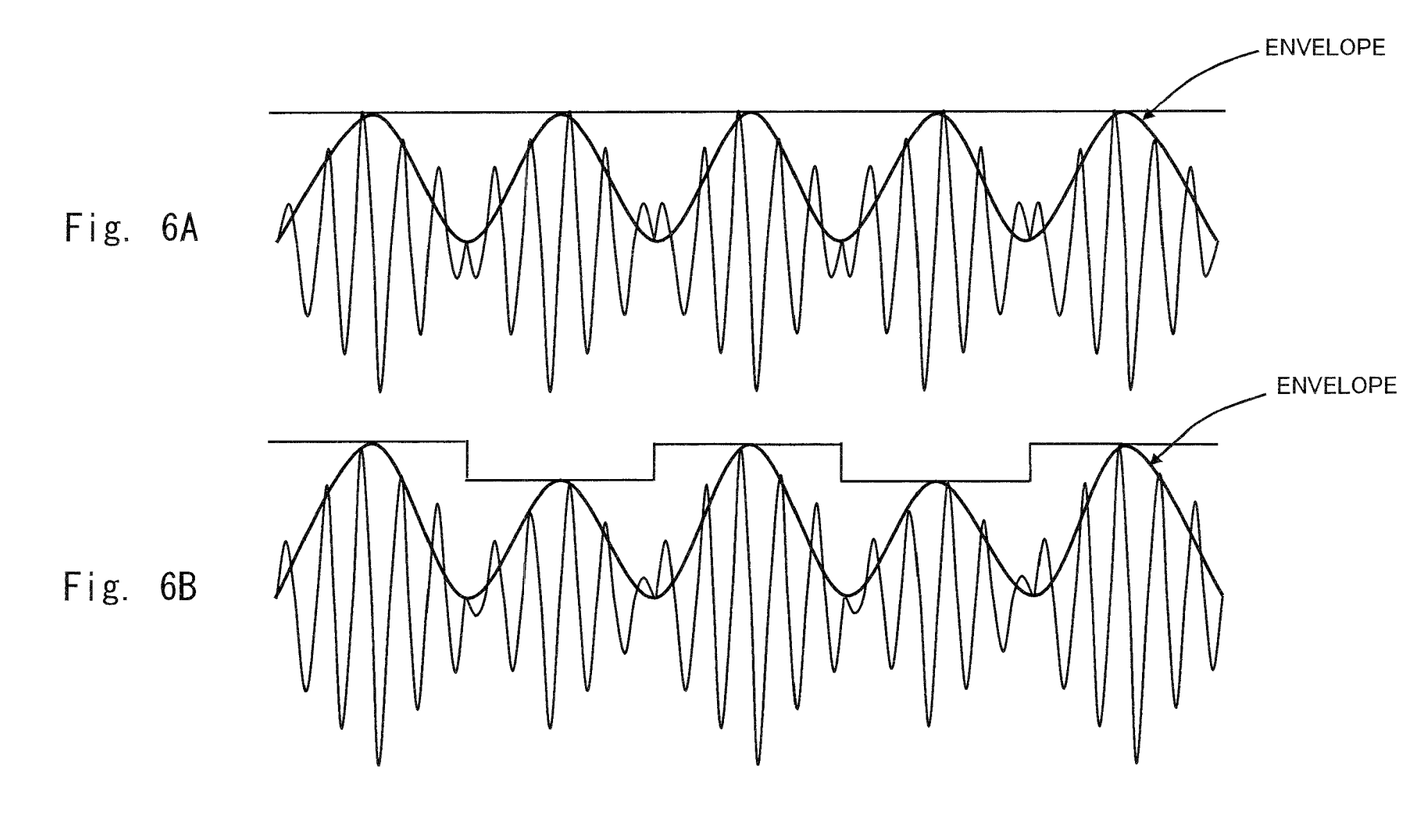
FIGS. 6A and 6B each shows a signal waveform diagram when a test signal of a sinusoidal wave is used according to the embodiment of the present invention.

FIG. 6A shows the envelope extracted by the envelope detection circuit 3 when there is no DC offset in the modulation circuit. When the sinusoidal wave having the equal amplitude is input to the modulator 1, the envelope of the maximum amplitude and the minimum amplitude of the signal output by the modulator 1 has the equal amplitude when the DC offset does not exist. So the envelope extracted by the envelope detection circuit 3 becomes constant. Note that the envelope is the waveform diagram that fluctuates periodically when the test signal is the sinusoidal wave. So the fact that the envelope is constant when the test signal is the sinusoidal wave means the fact that the apex of the amplitude value of the envelope is constant. In other words, the value of the apex of the envelope becomes constant.

FIG. 6B shows a signal waveform when the DC offset exists in the modulation circuit. The signal output by the modulation circuit generates a magnitude correlation between the maximum amplitude and the minimum amplitude. So the magnitude correlation according to the DC offset is generated in the envelope detected by the wave detector.

As in the case where the rectangular wave is used as the test signal, the amplitude of the envelope of the maximum amplitude value and the minimum amplitude value is compared and the DC offset is corrected. When the amplitude of the envelope becomes constant, an absolute value of the amplitude is compared with reference voltage and the output gain is controlled.

As stated above, in the modulation circuit disclosed in the present embodiment, the test signal for correcting the DC offset is output to the orthogonal modulator 9. The DC offset is corrected by detecting the envelope of the modulation signal by the envelope decision circuit 4 and by comparing the magnitude correlation of the envelope. Also, the gain of the orthogonal modulator 9 or the output amplifier 12 is controlled by comparing the envelope that is smoothed after the DC offset is corrected with the reference voltage signal that is to be output. So it is possible to correct the DC offset for suppressing the carrier leak and to control the gain at the same time.

The embodiment of the present invention has been described above in detail, but various changes can be made without departing from the spirit of the invention. For example, we described the envelope decision circuit 4 and the amplitude decision circuit 5 separately in the embodiment.

However, the envelope decision circuit 4 and the amplitude decision circuit 5 may be used together by connecting a switch.

It is apparent that the present invention is not limited to the above embodiment, but may be modified and changed without departing from the scope and spirit of the invention.

What is claimed is:

1. A modulation circuit comprising:
   a modulator modulating a received signal and outputting a modulated signal;
   a detector circuit receiving the modulated signal and outputting an envelope of the modulated signal;
   a first controller regulating an offset level of the modulator based on the envelope; and
   a second controller regulating gain of the modulated signal based on the envelope,
   wherein the first controller regulates the offset level based on first and second amplitudes of the envelope, the first amplitude being with regard to a maximum amplitude of the envelope, the second amplitude being with regard to a minimum amplitude of the envelope,
   the first controller compares the first and second amplitudes and regulates the offset level based on a result of comparing the first and second amplitudes,
   the first controller regulates the offset level for equalizing the first amplitude and the second amplitude, and
   the second controller regulates the gain after the first controller finished regulating the offset level.

2. The modulation circuit according to claim 1, wherein the second controller regulates the gain based on the regulated first and second amplitudes.

3. The modulation circuit according to claim 2, wherein the second controller regulates the gain by equalizing the regulated first and second amplitudes and a reference value.

4. A modulation circuit comprising: a modulator configured to modulate an input signal and to output a modulated signal; a detector circuit configured to receive the modulated signal and to output an envelope of the modulated signal; a first controller configured to regulate an offset level of the modulator based on the envelope; a second controller configured to regulate gain of the modulated signal based on the envelope; a test signal generation circuit configured to output a test signal to the modulator, the test signal having an equal amplitude in a positive direction and a negative direction from a reference potential, wherein the first controller regulates the offset level based on a first amplitude value and a second amplitude value, the first amplitude value being a maximum amplitude of a positive envelope corresponding to the test signal, and the second amplitude value being a maximum amplitude of a negative envelope corresponding to the test signal, wherein the second controller regulates the gain after the first controller finished regulating the offset level, the first controller compares the first amplitude value and the second amplitude value and regulates the offset level based on a result of comparing the first amplitude value and the second amplitude value.

5. The modulation circuit according to claim 4,
   wherein the second controller regulates the gain based on the envelope regulated by the first controller.

\* \* \* \* \*